US012652944B2

(12) United States Patent
Pang et al.

(10) Patent No.: US 12,652,944 B2
(45) Date of Patent: Jun. 9, 2026

(54) FLEXIBLE OLED LIGHT-EMITTING MODULE INCLUDING HOLES ARRANGED TO INCREASE AIR PERMEABILITY, AND MANUFACTURING METHOD THEREFOR

(71) Applicant: BEIJING SUMMER SPROUT TECHNOLOGY CO., LTD., Beijing (CN)

(72) Inventors: Huiqing Pang, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 945 days.

(21) Appl. No.: 17/850,379

(22) Filed: Jun. 27, 2022

(65) Prior Publication Data

US 2022/0416205 A1     Dec. 29, 2022

(30) Foreign Application Priority Data

Jun. 29, 2021    (CN) .......................... 202110722391.8

(51) Int. Cl.
    *H10K 77/10*         (2023.01)
    *H05K 1/189*         (2026.01)
                (Continued)

(52) U.S. Cl.
    CPC ........... *H10K 77/111* (2023.02); *H05K 1/189* (2013.01); *H10K 59/873* (2023.02); *H10K 59/90* (2023.02);
                (Continued)

(58) Field of Classification Search
    CPC .. H10K 77/111; H10K 50/844; H10K 59/873; H10K 59/90; H10K 71/00;
                (Continued)

(56) References Cited

U.S. PATENT DOCUMENTS 6,596,016 B1    7/2003  Vreman et al.
6,811,563 B2    11/2004 Savage, Jr. et al.
                (Continued)

FOREIGN PATENT DOCUMENTS

CA          2683090 A1    11/2008
CN        102481456 A      5/2012
                (Continued)

OTHER PUBLICATIONS

Nam et al., "The Efficacy and Safety of 660 nm and 411 to 777 nm Light-Emitting Devices for Treating Wrinkles," Am Soc for Derm Surg 43:371-380 (2017), 10 pages.
                (Continued)

*Primary Examiner* — Toan Ton
(74) *Attorney, Agent, or Firm* — ArentFox Schiff LLP; Joseph M. Maraia

(57)         ABSTRACT

Provided are a flexible OLED light-emitting module and a preparation therefor. The flexible OLED light-emitting module includes: a flexible substrate having a plurality of holes A, an OLED having a plurality of holes B, an encapsulation layer having a plurality of holes C, and an external circuit, where the holes A, B and C coincide to form through-holes penetrating the light-emitting module, and the OLED device has a common organic light-emitting layer. The new flexible OLED light-emitting module has good air permeability due to through-holes and thus can be used in various phototherapy devices so that the phototherapy devices not only have a large light-emitting area, but also have good air permeability and are suitable for long-term wearing. Further provided are a method for preparing the flexible OLED light-emitting module and a phototherapy device including the flexible OLED light-emitting module.

36 Claims, 7 Drawing Sheets

(51) Int. Cl.

| | | |
|---|---|---|
| *H10K 59/80* | (2023.01) | |
| *H10K 59/82* | (2023.01) | |
| *H10K 59/90* | (2026.01) | |
| *H10K 102/00* | (2023.01) | |

(52) U.S. Cl.
CPC ... *H05K 2201/10128* (2013.01); *H10K 59/82* (2023.02); *H10K 2102/311* (2023.02)

(58) Field of Classification Search
CPC ............ H10K 59/82; H10K 2102/311; H10K 50/805; H10K 50/81; H05K 1/189; H05K 2201/10128; A61N 5/06; A61N 2005/0653
USPC .......................................................... 257/40
See application file for complete search history.

(56) References Cited

U.S. PATENT DOCUMENTS

| | | | |
|---|---|---|---|
| 6,974,224 | B2 | 12/2005 | Thomas-Benedict |
| 8,927,308 | B2 | 1/2015 | Pang et al. |
| 10,525,278 | B2 | 1/2020 | Wasserbauer et al. |
| 2009/0030489 | A1 | 1/2009 | Asvadi et al. |
| 2010/0179469 | A1 | 7/2010 | Hammond et al. |
| 2016/0190389 | A1* | 6/2016 | Lee .................... H10K 59/8731 438/28 |
| 2019/0305252 | A1* | 10/2019 | Dai ......................... H10K 71/00 |
| 2019/0376650 | A1* | 12/2019 | Pang ...................... H10K 71/00 |
| 2020/0328267 | A1* | 10/2020 | Li ......................... H10D 86/021 |

FOREIGN PATENT DOCUMENTS

| | | | | |
|---|---|---|---|---|
| CN | 102015021 | B | 9/2013 | |
| CN | 203694423 | U | 7/2014 | |
| CN | 102784437 | B | 3/2015 | |
| CN | 104505373 | A | 4/2015 | |
| CN | 104576709 | A | 4/2015 | |
| CN | 204502144 | U | 7/2015 | |
| CN | 204951964 | U | 1/2016 | |
| CN | 205108772 | U | 3/2016 | |
| CN | 105742321 | A | 7/2016 | |
| CN | 106139413 | A | 11/2016 | |
| CN | 205984154 | U | 2/2017 | |
| CN | 206198484 | U | 5/2017 | |
| CN | 106856227 | A | 6/2017 | |
| CN | 104576709 | B | 7/2017 | |
| CN | 107425039 | A | 12/2017 | |
| CN | 107676638 | A | 2/2018 | |
| CN | 108400152 | A | 8/2018 | |
| CN | 108553765 | A | 9/2018 | |
| CN | 108644628 | A | 10/2018 | |
| CN | 109123868 | A | 1/2019 | |
| CN | 109173071 | A | 1/2019 | |
| CN | 109173075 | A | 1/2019 | |
| CN | 110038231 | A | 7/2019 | |
| CN | 111450421 | A | 7/2020 | |
| CN | 111481833 | A | 8/2020 | |
| CN | 111514466 | A | 8/2020 | |
| CN | 111544774 | A | 8/2020 | |
| CN | 111554732 | A * | 8/2020 | ........... A61N 5/0621 |
| CN | 112687811 | A | 4/2021 | |
| CN | 112754764 | A | 5/2021 | |
| TW | 200718447 | A | 5/2007 | |

OTHER PUBLICATIONS

Barolet et al., "Light-emitting diodes (LEDs) in dermatology," Semin Cutan Med Surg 27(4):227-38, DOI: 10.1016/j.sder.2008.08.003 (Dec. 2008), 12 pages.

Product Information for COSBeauty laser hair generator scalp massage helmet, Kaoloa.com (retrieved Nov. 13, 2023), 45 pages.

Handbook of Photomedicine, Michael R. Hamblin, Ph.D. (ed.), CRC Press, Taylor & Francis Group, (2014), 53 pages.

Product Information for BiliTx Phototherapy System, Philips.com (retrieved Nov. 13, 2023), 5 pages.

Jeon et al., "A Wearable Photobiomodulation Patch Using a Flexible Red-Wavelength OLED and Its In Vitro Differential Cell Proliferation Effects," Adv Mater Tech, vol. 3, No. 5, DOI: 10.1002/admt.201700391 (2018), 10 pages.

Search Report in CN Application No. 202110722391.8 dated Jun. 19, 2023, with English translation, 4 pages.

Office Action in CN Application No. 202110722391.8 dated Jun. 25, 2023, with English translation, 10 pages.

\* cited by examiner

100

110
109
108
107
106
105
104
103
102
101

200

205
204
203
202
201

300

303
304
302
301

FLEXIBLE OLED LIGHT-EMITTING MODULE INCLUDING HOLES ARRANGED TO INCREASE AIR PERMEABILITY, AND MANUFACTURING METHOD THEREFOR

CROSS-REFERENCE TO RELATED APPLICATION(S)

This application claims priority to Chinese Patent Application No. CN 202110722391.8 filed on Jun. 29, 2021, the disclosure of which is incorporated herein by reference in its entirety.

TECHNICAL FIELD

The present disclosure relates to a flexible OLED(organic light-emitting diode) light-emitting module, in particular, to a flexible OLED light-emitting module having a through-hole structure, a method for manufacturing the flexible OLED light-emitting module and a phototherapy apparatus including the flexible OLED light-emitting module.

BACKGROUND

In the middle and late 20th century, technologies such as low-light laser treatment and photobiomodulation (PBM) emerged, and all of these technologies use light as a means to treat diseases in the medical field (Michael R. Hamblin, Ying-ying Huang, Handbook of Photomedicine, CRC Press). Many studies have shown that red to near-infrared light can help promote the regeneration of collagen and skin cells and can be applied in the fields of anti-wrinkle and cosmetic treatment, wound healing, spot and scar removal, hair growth and so on (Chan Hee Nam et al., Dermatologic Surgery, 2017; 43: 371-380; Daniel Barolet, Semin Cutan Med Surg, 27: 227-238, 2008; Yongmin Jeon et al., Adv. Mater. Technnol. 2018, 1700391). Meanwhile, blue light irradiation is also the most effective means to treat jaundice in infants at present. Phototherapy products using semiconductor light-emitting diodes (LEDs) as light sources and integrated on flexible substrates have gradually emerged (U.S. Pat. Nos. 6,811,563, 6,596,016, and 6,974,224), and even commercial phototherapy blankets for treating neonatal jaundice have been available, such as BiliTX products of Philips Company (https://www.philips.com.cn/healthcare/product/HC866437/bilitx-).

A variety of anti-aging and skin-tightening phototherapy devices have been used in beauty salons, such as commercially available LED facial masks. These products arrange LED chips in an array on the back of the plastic mask. The LED is a high-intensity point light source, usually accompanied by heating. Therefore, the LED light source is generally integrated with a heat dissipation device to reduce the temperature, and these LEDs must be arranged at a certain distance to dissipate heat when the LEDs are used in array form. There are three disadvantages of LED facial masks. First, such a facial mask is very thick and heavy, because considering heat dissipation, the facial mask must be equipped with a heat dissipation device. In addition, the facial mask must be used at a certain distance from the face for safety. Some of these facial masks even weigh 1.6 kg, and it is very uncomfortable when these facial masks are worn on the face. Second, in the array arrangement, LEDs are all independent in a certain position and spaced at intervals, leading to uneven illumination. In cosmetic treatment, such uneven illumination may lead to uneven skin color or require multiple treatments in different areas.

Finally, in order to cover the whole face, a large number of LEDs are required, sometimes as many as 200 chips. The requirement of a large number of LEDs increases the difficulty of LED screening, assembly and maintenance.

In addition, products using LEDs or laser arrays as light sources are also common in some hair growth cap products (https://goods.kaola.com/product/9018726.html) and patent applications, such as those using lasers as light sources (CN102015021B, CN110038231A, and TW200718447A), those using semiconductor LEDs as light sources (CA2683090A1, CN102784437B, CN106139413A, CN107676638A, CN109123868A, CN109123868A, CN204502144U, CN206198484U, and U.S. Pat. No. 10,525,278 B2), and those using LEDs or laser as light sources conducted by optical fibers (CN108553765A and CN109173075A). For the same reasons described above, all of these products are inevitably heavy and hot with bad air permeability, and are not ideal wearable products.

On the contrary, the OLED is an area light source as well as a cold light source, is not dazzling, has the characteristics of lightness and thinness, and thus can be easily integrated on the flexible substrate. Due to the characteristics described above, the OLED is an ideal light source for wearable applications, and related patent applications have covered various fields in recent years. Patent applications CN205108772, CN204951964 and CN102481456 all mention that OLED light sources can be used in wearable products for medical treatment. US2009/0030489A1 and US2010/0179469A1 mention that the OLED with a wavelength near 450 nm is used as a light source to treat jaundice in infants, and the application CN111450421A that the inventor of the present disclosure previously provides proposes to convert flexible green OLED into blue light in combination with TTA up-conversion to treat jaundice; the applications CN203694423 and CN109173071 that the inventor of the present disclosure previously provides mention the use of the OLED for the preparation of phototherapy facial masks; patent applications CN111481833A, CN111514466A, CN111544774A and CN112754764A that the inventor of the present disclosure previously provides mention the use of the OLED for the preparation of hair growth hats, weight loss shaping garments, phototherapy socks and band-aids, respectively. However, although the flexible OLED can meet the requirements of phototherapy products in terms of shape and function, the flexible OLED is usually prepared on the whole plastic substrate and needs to be tightly packaged, causing the air permeability to be worse. Therefore, for products that need to be worn for a long time, such as facial masks, clothes, hats and band-aids, the comfortableness becomes worse, and those products may even cause allergies and other skin diseases.

CN108400152A and CN104576709B both mention the method of forming holes on OLED display screens. The purpose of CN108400152A is to form a hole on the OLED display screen for placing a camera. In this application, a hole is formed on the protection layer (i.e., the encapsulation layer) and the OLED device, but the hole will not penetrate the substrate; in addition, there is only one hole for the camera on the display screen, and the diameter of the hole is at least 3 mm. In the present disclosure, a plurality of holes are distributed on the complete OLED light-emitting panel and penetrate all layers, the hole diameter does not exceed 2 mm, and the holes are used for phototherapy illumination and are not filled with other materials or components. At this point, these holes are different from the holes described in the above applications in the structure and preparation process. CN104576709B applies OLED display screens in the wearable field and designs holes to increase air permeability. However, first of all, CN104576709B provides a display screen having a complex backplane circuit and including multiple pixels. In use, the whole backplane circuit part contacts with human skin while the light-emitting surface faces the side far away from the human body, so the holes must penetrate the whole backplane circuit area. At this point, in order to avoid the active circuit part, only the display area is hollowed out, proposing high requirements for alignment. In addition, the diameter of the hole is limited by the pixel size, and the diameter of the hole is required to be below 80 μm in this application, which puts forward high requirements for the opening process. For the non-pixelated flexible OLED light-emitting panel used in the present application, since there is no backplane circuit, an externally-driven connection structure needs to be equipped after the panel is prepared, and generally, the step of soldering a circuit board and the resulting process adjustment are added in the preparation process.

SUMMARY

The present disclosure aims to provide a flexible OLED light-emitting module with good air permeability to solve at least part of the above problems. The flexible OLED light-emitting module includes: a flexible substrate having a plurality of holes A, wherein the diameter of each hole A is between 0.09 mm and 5 mm, the minimum spacing between the holes A is between 1 mm and 50 mm, and the area ratio of the holes A is 0.01% to 50%; an OLED having a plurality of holes B; an encapsulation layer having a plurality of holes C; and an external circuit. The new flexible OLED light-emitting module has good air permeability due to through-holes and thus can be used in various phototherapy devices so that the phototherapy devices not only have a large light-emitting area, but also have good air permeability and are suitable for long-term wearing. The present disclosure also discloses a method for preparing the flexible OLED light-emitting module, in particular a method for forming holes: target holes may be etched on a flexible substrate by laser before an OLED device is deposited; or, holes may be etched by laser or other processes after the deposition of the whole OLED is completed and the encapsulation of at least part of thin films is completed.

According to an embodiment of the present disclosure, a flexible OLED light-emitting module is disclosed, including:
  a flexible substrate having a plurality of holes A;
  an OLED device having a plurality of holes B and a contact electrode;
  an encapsulation layer having a plurality of holes C; and
  an external circuit, wherein the external circuit is electrically connected to the contact electrode;
  wherein the holes A, B and C coincide to form through-holes penetrating the light-emitting module; the diameter of each of the plurality of holes A is between 0.09 mm and 5 mm, the diameters of each of the plurality of holes B and each of the plurality of holes C are between 90% to 100% of the diameter of each of the plurality of holes A, the minimum spacing between the plurality of holes A is S, and S is between 1 mm and 50 mm; and
  the OLED device has a common organic light-emitting layer.

In this embodiment, the diameter of the hole is the diameter of the smallest circle which can completely cover the cross-section of the hole, with the center of the hole as the center of the circle.

In the present disclosure, the expression that the holes A, B and C coincide means that the vertical projection of holes A, B and C on the substrate plane partially or completely coincides.

According to an embodiment of the present disclosure, wherein, the external circuit is a flexible printed circuit (FPC) circuit board.

According to an embodiment of the present disclosure, wherein, the diameter of each of the plurality of holes A is between 0.1 mm and 3 mm.

According to an embodiment of the present disclosure, wherein, the diameter of each of the plurality of holes A is between 0.3 mm and 1 mm.

According to an embodiment of the present disclosure, wherein, the plurality of holes A have the same diameter.

According to an embodiment of the present disclosure, wherein, the minimum spacing S between the plurality of holes A is between 1 mm and 30 mm.

According to an embodiment of the present disclosure, wherein, the minimum spacing S between the plurality of holes A is between 1 mm and 10 mm.

According to an embodiment of the present disclosure, wherein, the plurality of holes A are arranged at equal spacing.

According to an embodiment of the present disclosure, wherein, the cross-section of each of the plurality of holes A, B and C is a circle, a polygon or an ellipse.

According to an embodiment of the present disclosure, wherein, the cross-section of each of the plurality of holes A, B and C is a circle or a regular polygon.

According to an embodiment of the present disclosure, wherein, the cross-section of each of the plurality of holes A, B and C is a circle.

According to an embodiment of the present disclosure, wherein, the area ratio of the plurality of holes A to the flexible substrate is between 0.01% and 50%.

According to an embodiment of the present disclosure, wherein, the area ratio of the plurality of holes A to the flexible substrate is between 0.1% and 30%.

According to an embodiment of the present disclosure, wherein, the area ratio of the plurality of holes A to the flexible substrate is between 0.2% and 10%.

According to an embodiment of the present disclosure, wherein, the OLED device emits at least one light with a wavelength between 400 nm and 2000 nm.

According to an embodiment of the present disclosure, wherein, the OLED device emits at least one light with a wavelength between 450 nm and 1000 nm.

According to an embodiment of the present disclosure, wherein, the OLED device emits at least one light with a wavelength between 600 nm and 970 nm.

According to an embodiment of the present disclosure, wherein, the thickness of the flexible substrate is between 25 μm and 500 μm.

According to an embodiment of the present disclosure, wherein, the thickness of the flexible substrate is between 30 μm and 200 μm.

According to an embodiment of the present disclosure, wherein, the thickness of the flexible substrate is between 50 μm and 100 μm.

According to an embodiment of the present disclosure, wherein, the material used for the flexible substrate is ultra-thin flexible glass, plastic, metal foil, paper, textile or combinations thereof.

According to an embodiment of the present disclosure, wherein, the material used for the flexible substrate is plastic, metal foil, paper, textile, leather or combinations thereof.

According to an embodiment of the present disclosure, wherein, the material used for the flexible substrate is plastic.

According to an embodiment of the present disclosure, the material used for the flexible substrate is polyethylene terephthalate (PET), polyethylene naphthalate (PEN) or polyimide (PI).

According to an embodiment of the present disclosure, wherein, the material used for the flexible substrate is PI.

According to an embodiment of the present disclosure, wherein, the encapsulation layer is thin-film encapsulation layer.

According to an embodiment of the present disclosure, wherein, the flexible OLED light-emitting module further includes a protective film and/or a flexible film.

According to an embodiment of the present disclosure, wherein, the protective film and/or the flexible film is transparent, or the protective film is an FPC circuit board, or the protective film and/or the flexible film is of a plastic or silicone rubber material, or the protective film and/or the flexible film is made of a natural material selected from silk or cotton and linen.

According to an embodiment of the present disclosure, wherein, the protective film and/or the flexible film is made of a natural material selected from silk or cotton and linen.

According to an embodiment of the present disclosure, wherein, the protective film has a plurality of holes D and/or the flexible film has a plurality of holes E; wherein the coincidence degree between the plurality of holes D and/or E with the plurality of holes A, B and C is more than 50%.

According to an embodiment of the present disclosure, wherein, the coincidence degree between the plurality of holes D and/or E with the plurality of holes A is more than 70%.

According to an embodiment of the present disclosure, wherein, the thickness of the protective film and/or the flexible film is between 25 $\mu$m and 500 $\mu$m.

According to an embodiment of the present disclosure, wherein, the thickness of the protective film and/or the flexible film is between 50 $\mu$m and 200 $\mu$m.

According to an embodiment of the present disclosure, wherein, the edges of the plurality of holes A, B and C are sealed as a result of melting of the protective film and/or the flexible film.

According to an embodiment of the present disclosure, wherein, the plurality of holes A, B C, D, and E are formed simultaneously.

According to an embodiment of the present disclosure, wherein, the plurality of holes A, B and C are formed by a method selected from the group consisting of: stamping, dry etching, wet etching, laser etching, plasma bombardment, and combinations thereof.

According to an embodiment of the present disclosure, wherein, the plurality of holes A, B and C are formed by laser etching.

According to another embodiment of the present disclosure, a method for preparing the flexible OLED light-emitting module described in any of the preceding embodiments is disclosed, including the following steps:
    a. acquiring a support substrate;
    b. applying a flexible substrate on the support substrate;
    c. preparing an OLED device;

d. encapsulating the OLED device and exposing a contact electrode;
    e. electrically connecting an external circuit to the contact electrode of the OLED device;
    f. peeling off the support substrate;
    perforating step 1. forming a plurality of holes A on the flexible substrate, wherein the diameter of each of the plurality of holes A is between 0.09 mm and 5 mm, and the minimum spacing between the plurality of holes A is between 1 mm and 50 mm;
    perforating step 2. forming a plurality of holes B and a plurality of holes C on the OLED device and an encapsulation layer, respectively, wherein, the diameters of each of the plurality of holes B and each of the plurality of holes C are between 90% to 100% of the diameter of each of the plurality of holes A, and the holes B and C and the holes A coincide;
    wherein in the above steps, perforating step 1 may occur at any time after step b, and perforating step 2 may occur simultaneously with step c or at any time after step c.

According to an embodiment of the present disclosure, wherein, the external circuit in step e is an FPC circuit board.

According to an embodiment of the present disclosure, wherein, perforating step 1 occurs between step b and step c, or between step d and step e, or between step e and step f.

According to an embodiment of the present disclosure, wherein, perforating step 2 occurs simultaneously with step c, or between step d and step e, or between step e and step f, or after step f.

According to an embodiment of the present disclosure, wherein, perforating step 1 and perforating step 2 occur simultaneously.

According to an embodiment of the present disclosure, wherein, the method further includes step j and/or step k, wherein step j is to apply a protective film and can occur at any time after step d, and step k is to apply a flexible film and can occur at any time after step f.

According to an embodiment of the present disclosure, wherein, step j further includes step j-1, wherein step j-1 is to form a plurality of holes D on the protective film.

According to an embodiment of the present disclosure, wherein, step j occurs between step d and step e, or between step e and step f, or after step f, or simultaneously with step e.

According to an embodiment of the present disclosure, wherein, step j-1 and step j occur simultaneously, or step j-1 and perforating steps 1 and/or 2 occur simultaneously.

According to an embodiment of the present disclosure, wherein, step k-1 and step k occur simultaneously, or step k-1 and perforating steps 1 and/or 2 occur simultaneously.

According to an embodiment of the present disclosure, wherein, the method further includes step 1, wherein step 1 is to melt and seal edges of the plurality of holes A, B, C, D, and/or E.

According to another embodiment of the present disclosure, a phototherapy apparatus is further disclosed, including at least one flexible OLED light-emitting module, wherein the specific structure of the flexible OLED light-emitting module is shown in any of the preceding embodiments.

In an embodiment of the present disclosure, the phototherapy device is selected from the group consisting of: a phototherapy facial mask, a phototherapy eye mask, a phototherapy neck protector, a phototherapy hair growth cap, a phototherapy waistband, a phototherapy blanket, a phototherapy band-aid, a phototherapy plaster patch, a phototherapy glove, a phototherapy sock or a phototherapy garment.

The flexible OLED light-emitting module disclosed by the present disclosure includes: a flexible substrate having a plurality of holes A, an OLED having a plurality of holes B, an encapsulation layer having a plurality of holes C, and an external circuit. The new flexible OLED light-emitting module has good air permeability due to through-holes and thus can be used in various phototherapy devices so that the phototherapy devices not only have a large light-emitting area, but also have good air permeability and are suitable for long-term wearing.

DETAILED DESCRIPTION

Figure 1:
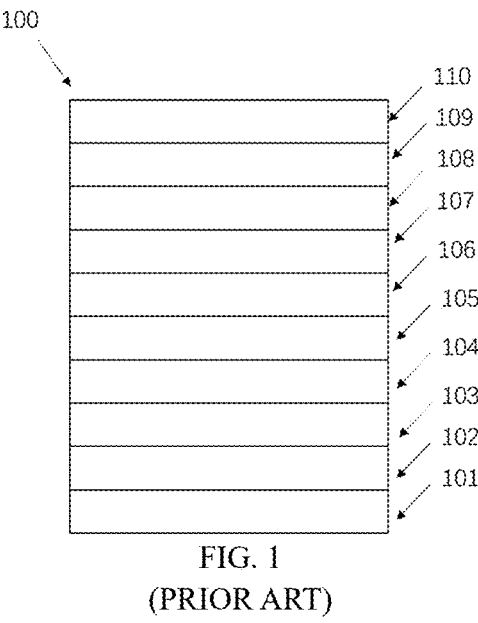
FIG. 1 (Prior Art) is a schematic diagram showing the structure of a single-layer OLED device.

The structure of a typical single-layer OLED device 100 is shown in FIG. 1. The OLED device 100 includes an anode layer 101, a hole injection layer (HIL) 102, a hole transporting layer (HTL) 103, an electron blocking layer (EBL) 104, an emissive layer (EML) 105, a hole blocking layer (HBL) 106, an electron transporting layer (ETL) 107, an electron injection layer (EIL) 108, a cathode layer 109 and a capping layer (CPL) 110. In a bottom-emission device, the anode layer 101 is a transparent or translucent material, including, but not limited to, indium tin oxide (ITO), indium zinc oxide (IZO), molybdenum oxide ($MoO_x$) and the like, with a transparency generally greater than 50%, preferably greater than 70%; and the cathode layer 109 is a material having a high reflectivity, including, but not limited to, Al, Ag and the like, with a reflectivity greater than 70%, preferably greater than 90%. In a top-emission device, the anode layer 101 is a material having a high reflectivity or combinations of materials having a high reflectivity, including, but not limited to, Ag, Ti, Cr, Pt, Ni, TiN, and combinations of the above materials with ITO and/or $MoO_x$, typically with a reflectivity greater than 50%, preferably greater than 80%, more preferably greater than 90%; and the cathode layer 109 should be a translucent or transparent conductive material, including, but not limited to, MgAg alloy, $MoO_x$, Yb, Ca, ITO, IZO or combinations thereof, with a transparency generally greater than 30%, preferably greater than 50%. The electron injection layer 108 may be a monolayer metal such as Yb or an organic material such as LiQ. The emissive layer 105 generally further includes at least one host material and at least one luminescent material, the electron blocking layer 104 and the hole blocking layer 106 are optional layers, and the capping layer 110 may not be required in the bottom-emission device. The hole injection layer 102 may be a single material layer such as commonly used HATCN; the hole injection layer 102 may also be a hole transporting material doped with a certain proportion of p-type conductive doped material, where the doping proportion is generally not higher than 5% and commonly between 1% and 3%.

Figure 2:
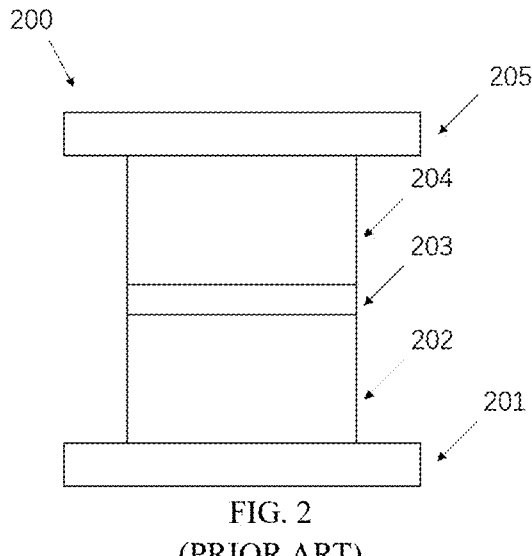
FIG. 2 (Prior Art) is a schematic diagram showing the structure of a stacked OLED device.

The structure of a typical stacked OLED device 200 is shown in FIG. 2, and the stacked OLED device 200 includes an anode layer 201, a first light-emitting unit 202, a charge generation layer (CGL) 203, a second light-emitting unit 204, and a cathode layer 205. The first light-emitting unit 202 and the second light-emitting unit 204 may further include a plurality of organic layers 102 to 108 in the single-layer light-emitting device 100, and the emissive layers of the first light-emitting unit and the second light-emitting unit may be the same or different. The charge generation layer 203 is generally composed of an n-type material and a p-type material, and a buffer layer may be added as described in patent application CN112687811A. If the stacked device is a top-emission device, a capping layer (not shown) may also be added on the cathode layer 205. FIG. 2 shows a two-unit stacked device, and on the basis of the structure shown in FIG. 2, a third light-emitting unit and a second charge generation layer can be added to form a three-unit stacked device. The preparation of single-layer and stacked OLED devices is well known in the industry, and details will not be repeated herein.

Figure 3:
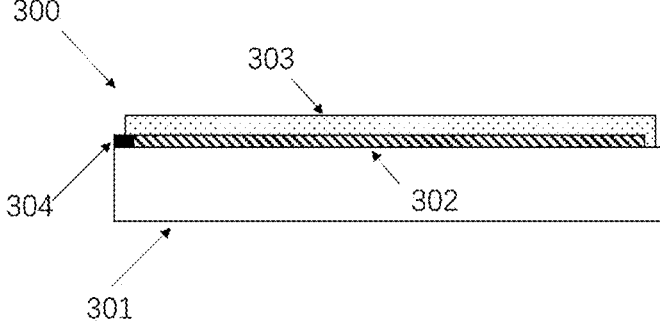
FIG. 3 is a cross-sectional view of a flexible OLED light-emitting plane of the present disclosure.

A flexible OLED light source can be a flexible OLED light-emitting panel. The cross-sectional view of a flexible OLED light-emitting plane is shown in FIG. 3. The flexible OLED light-emitting panel 300 includes a flexible substrate 301, an OLED device 302, a pair of contact electrodes 304 electrically connected to the OLED device 302, and a flexible encapsulation layer 303, but the contact electrodes 304 are exposed. The flexible substrate 301 may be an ultra-thin flexible glass, preferably a non-breakable material, including, but not limited to, plastic (PET, PEN, and PI), textiles, leather, paper, metal foil or combinations thereof. In particular, the substrate 301 may be a material (e.g. PI, i.e. polyimide) which is previously coated on a support baseplate in solution form and used for device preparation after curing and planarization. After the device is prepared, the material is peeled off from the support baseplate by laser and transferred to other flexible films as required. The flexible substrate 301 may be additionally coated with a moisture barrier layer (not shown). The OLED device 302 may be a bottom-emission device or a top-emission device, preferably a top-emission device because the light-emitting efficiency of the top-emission device is higher. The OLED device 302 may be a single-layer structure or a stacked structure, preferably a stacked structure because the stacked structure has a longer lifetime at the same brightness and the thicker film layer of the stacked structure facilitates the increase of production yields. The organic material in the OLED device 302 may be formed by evaporation in the form of thermal evaporation in a vacuum chamber (vacuum evaporation method), or may be partially or completely formed by a solution method, including but not limited to ink jet printing, spin coating, organic vapor jet printing (OVJP), and the like. The flexible encapsulation layer 303 may be an ultra-thin glass adhered to the device by a UV curing adhesive.

Preferably, the flexible encapsulation layer 303 is a thin film encapsulation layer whose thickness is usually more than 5 μm, for example, a single inorganic film or a multi-layer structure in which organic and inorganic films alternate, and the film is formed by PECVD (plasma-enhanced chemical vapor deposition), ALD (atomic layer deposition), printing, spin coating and the like. The contact electrodes 304 may include at least one anode contact and one cathode contact. On this basis, a light extraction layer, a front cover film, a rear cover film, an external circuit (such as an FPC circuit board) and the like can also be added, and the specific description can be found in the Chinese patent application CN108644628A, the content of which is incorporated by reference in its entirety and is not within the study scope of the present disclosure. When such a flexible OLED light-emitting panel is electrically connected to an external electric drive (whether in an on or off state), a flexible OLED light source is formed, which is one of the basic constituent elements of the present disclosure. The OLED devices in the flexible OLED light-emitting panel all use a common organic layer and especially have a common organic light-emitting layer, that is, the OLED devices are subjected to non-pixelated processing and can only emit light of one color at a fixed working point. The flexible OLED light-emitting panel can emit at least one light with a wavelength of 400 nm to 2000 nm, and preferably, the flexible OLED light-emitting panel can emit at least one light with a wavelength of 450 nm to 1000 nm. If the flexible OLED light-emitting panel is used for facial masks, band-aids and other scenes, the flexible OLED light-emitting panel is preferably red and near-infrared OLED light-emitting panels, that is, the flexible OLED light-emitting panel can emit at least one light with a wavelength between 600 nm and 970 nm.

Since the substrate, the encapsulation layer, the front cover film and the rear cover film used in the flexible OLED light-emitting panel are usually made of artificial materials with poor air permeability, if the flexible OLED light-emitting panel is made into phototherapy products for long-term wearing, such as facial masks and hair growth hats, the comfortableness will be reduced, and those products may even cause allergies and other skin diseases. In order to solve this problem on the basis of not significantly reducing the effective light-emitting area, the present disclosure proposes that holes are arranged on the flexible OLED light-emitting panel to increase the air permeability and provides concrete and feasible solutions.

Figure 4A:
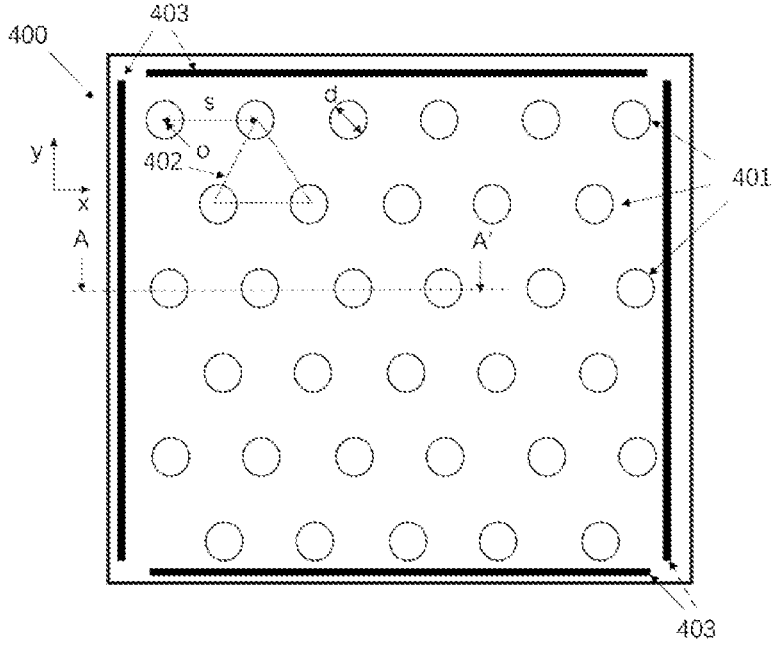
FIGS. 4A to 4B are partial plan views of a flexible OLED light-emitting plane of the present disclosure.
Figure 4B:
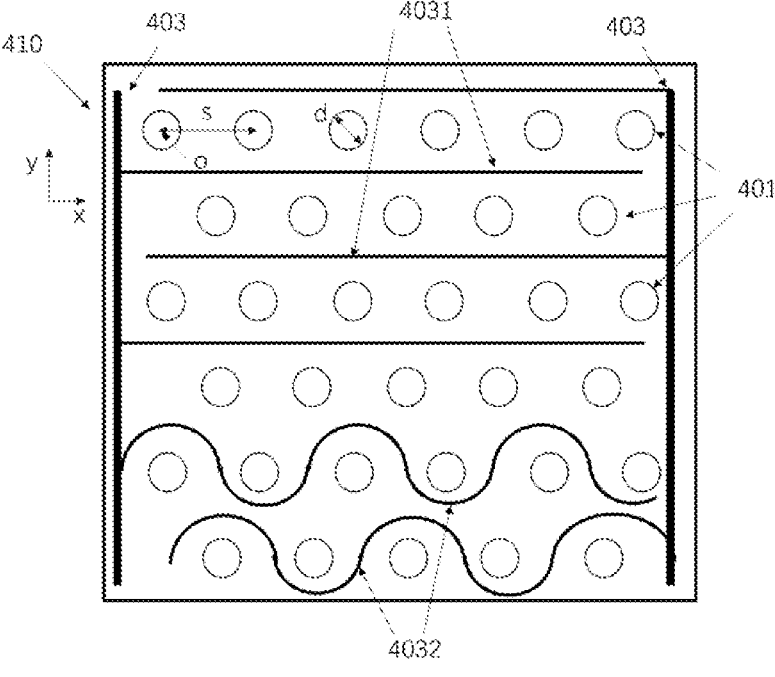

FIGS. 4A to 4B show partial plan views of a flexible OLED light-emitting plane 400 with holes. There are a plurality of holes 401 on the flexible OLED light-emitting plane 400. Each hole 401 has a center o and a diameter d, and a spacing s between the holes. The hole area ratio F is defined as the ratio of the sum of cross-sectional areas of holes on the whole flexible OLED panel to the area of the whole flexible OLED panel. In FIGS. 4A to 4B, all the holes 401 have the same diameter, and the hole spacing is equal in both the x and y directions. In an array of equal-area holes equally spaced as shown in FIG. 4A, the hole area ratio F is the ratio of the area of holes contained in the unit triangle 402 to the area of the entire triangle. It is to be noted that in some embodiments, the holes 401 may be not equally spaced. For example, the holes are equally spaced in the x-direction with a spacing $s_1$ and equally spaced in the y-direction with a spacing $s_2$, where $s_1 \neq s_2$. In other embodiments, the holes 401 may also not be equally spaced in a single direction. However, preferably, the holes 401 are equally spaced in at least one direction of the x or y axis, and more preferably, the holes 401 are equally spaced in both the x and y directions. The holes 401 may also have different diameters d. For example, in facial masks, holes with larger openings (i.e. larger diameter d) may be used in sensitive parts, such as eyes, and holes with relatively smaller openings (i.e. smaller diameter d) may be used in non-sensitive parts, such as the forehead. According to the practical application needs, the hole area ratio F should be between 0.01% and 50%, preferably between 0.1% and 30%, more preferably between 0.2% and 10%. In order to ensure certain air permeability and minimize the loss of light-emitting area, the hole diameter d should be between 0.09 mm and 5 mm, preferably between 0.1 mm and 3 mm, more preferably between 0.3 mm and 1 mm. Likewise, the hole spacing s should be controlled between 1 mm and 50 mm, preferably between 1 mm and 30 mm, more preferably between 1 mm and 10 mm. Besides the circular holes shown in FIGS. 4A and 4B, the cross-section of the holes may be of other shapes, including, but not limited to, polygons (e.g., squares, hexagons, rectangles, triangles, and rhombus), ellipses, and the like, all of which are not drawn herein. For the convenience of processing, the cross-section of the hole is preferably a circle or a regular polygon, more preferably a circle. The contact electrodes 403 also need to be prepared on the flexible OLED light-emitting panel, such as electrode strips on the periphery of the panel as shown in FIGS. 4A and 4B. These contact electrodes, after the device is encapsulated, are electrically connected to an external circuit (such as an FPC circuit board) for external power drive. The final product can be implemented by using a single-piece flexible OLED light-emitting panel 400 or by splicing a plurality of flexible OLED light-emitting panels 400, each flexible OLED light-emitting panel can emit light of the same color or light of different colors, and for the specific splicing method, reference may be made to the description in the application US20190376650 that the inventor of the present disclosure previously provides.

When the flexible OLED light-emitting panel 400 is prepared as a phototherapy product (e.g., a light-emitting facial mask) in a single-piece form, the light-emitting area is usually large. At this point, in order to reduce the voltage drop generated when the current passes through the electrodes with low sheet resistivity, some metal buslines such as 4031 and 4032 shown in FIG. 4B can be prepared on the flexible OLED light-emitting panel. If the OLED light-emitting panel adopts the bottom-emission device structure, the resistivity of the anode (usually ITO) is usually large, its sheet resistance is generally about 10 ohm/sq to 25 ohm/sq, and then metal buslines can be pre-prepared on the anode to reduce the resistivity; and if the OLED light-emitting panel adopts the top-emission device structure, the resistivity of the cathode (usually MgAg alloy) is usually large, its sheet resistance is generally between 1 ohm/sq and 30 ohm/sq, and then metal buslines can be prepared on the cathode to reduce the resistivity. For the specific manner of preparing the metal buslines, reference may be made to the patent U.S. Pat. No. 8,927,308 that the inventor of the present disclosure previously provides. The metal bulines 4031 and 4032 shown in FIG. 4B are illustrative, and the arrangement of the metal bulines is well known in the industry and will not be described herein.

Figure 5A:
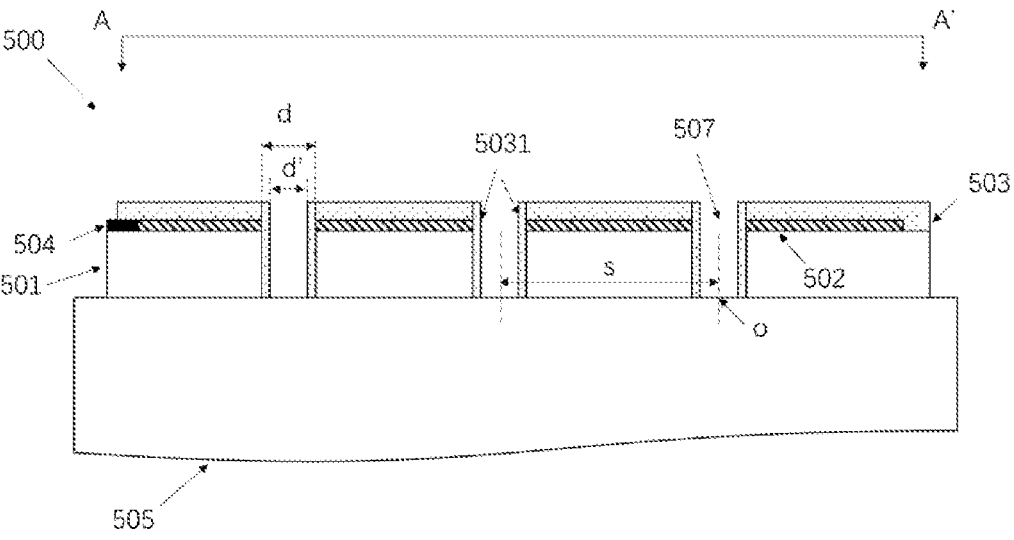
FIGS. 5A to 5E are cross-sectional structural views along the cutting line AA' in FIG. 4A.
Figure 5B:
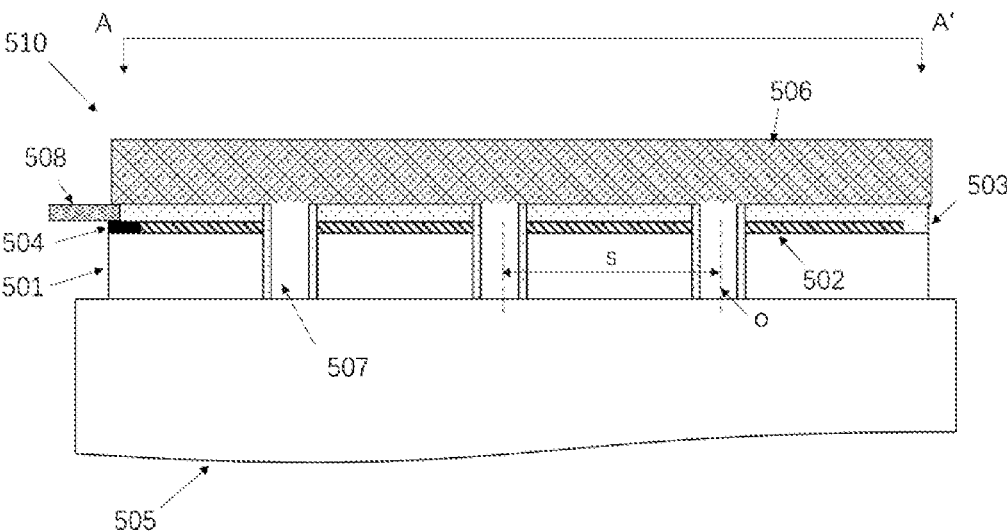
Figure 5C:
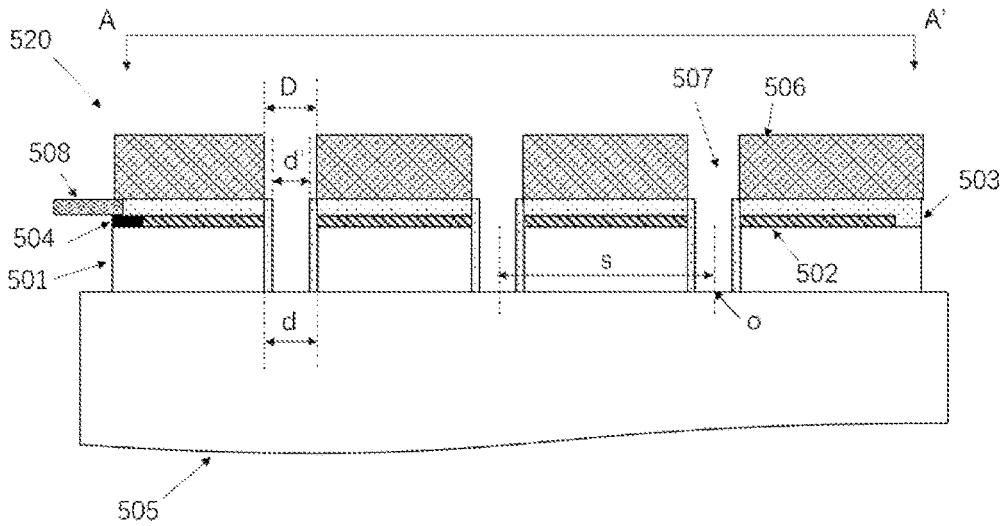
Figure 5D:
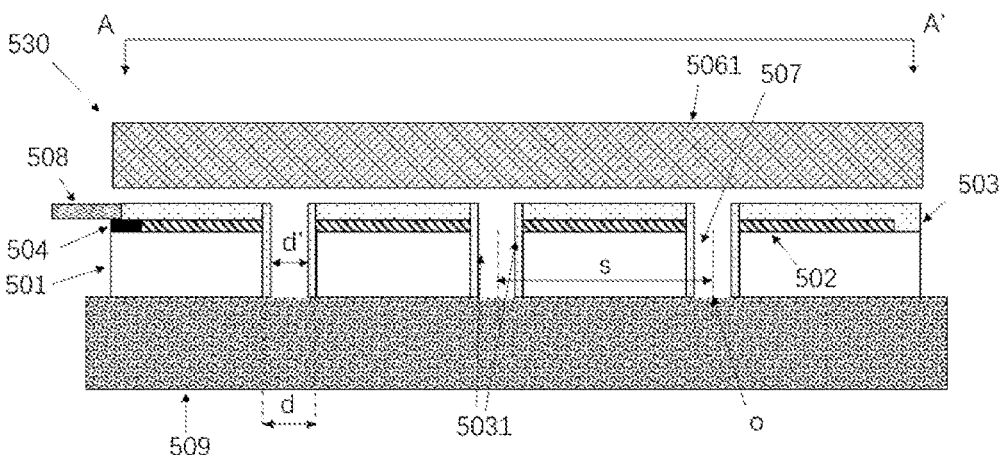
Figure 5E:
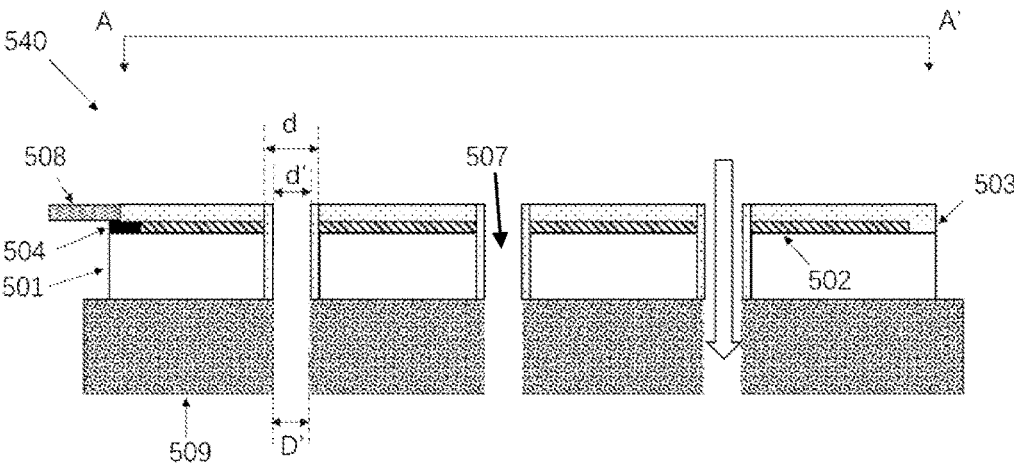

The cross-sectional structure 500 along the cutting line AA' in FIG. 4A is shown in FIG. 5A and includes a flexible substrate 501, an OLED device 502, an encapsulation layer 503, and a contact electrode 504. From the perspective of the AA' section, the flexible substrate 501, the OLED device 502, and the encapsulation layer 503 are all partitioned by a hole 507 (corresponding to the hole 401 in FIGS. 4A and 4B), but it is to be noted that from the perspective of the plan view of FIGS. 4A and 4B, they are still continuous outside the hole 401. In the preparation process, the flexible substrate 501 is applied to a support substrate 505 to ensure the normal process flow, and the support substrate 505 is generally hard, such as glass, silicon wafer and the like. If the flexible substrate 501 is a solid film, such as PET, PEN, aluminum foil and the like, the flexible substrate 501 can be fixed on the support substrate 505 using Kapton tape, and the flexible substrate 501 may also be a solid film coated with a moisture barrier layer; preferably, the PI solution is coated on the support substrate 505 by spin coating, printing, spraying or other manners and then the support substrate 505 is cured to form the flexible substrate 501. It is to be noted that the support substrate 505 will ultimately be removed and does not exist in the final product. One scheme for increasing the air permeability of the flexible OLED light-emitting panel is to carry out perforating processing on the flexible substrate 501 before the OLED device 502 is prepared. If the flexible substrate 501 is a solid film, the flexible substrate 501 may be perforated and then applied to the support substrate 505, and if the flexible substrate 501 is coated to the support substrate 505 in the form of a solution, the flexible substrate 501 may be perforated after curing. Herein, preferably, PI is coated by a solution method and then cured to form the flexible substrate 501. The thickness of the flexible substrate 501 is generally 25 μm to 500 μm, preferably 30 μm to 200 μm, more preferably 50 μm to 100 μm. In order to ensure accuracy and controllability, perforating is carried out by stamping, wet etching, dry etching, laser or the like, preferably by laser. A plurality of holes 507 are formed on the flexible substrate 501, each hole has a center o and a diameter d, and the spacing between two adjacent holes is s. Then, an OLED device 502 is prepared on the flexible substrate 501 that already has holes 507. Since the thickness of the flexible substrate is at least 25 μm and the overall thickness of the OLED device 501 is generally in the order of 1 μm to 2 μm, the organic film or metal electrode film of the OLED device will not cover the holes 507 during the preparation process. Moreover, due to in-situ growth, the center of the hole on the layer of the OLED device coincides with the center of the hole on the substrate. After the device is prepared, the device needs to be encapsulated, preferably by thin-film encapsulation, generally with a thickness of less than 10 μm. At this point, because the encapsulation process is generally isotropic, a part 5031 of the encapsulation layer will cover all the side of the OLED device 502 and some or even all the side of the flexible substrate 501. Therefore, the OLED device 502 can be effectively protected from erosion by water and oxygen in the environment from the side. Although the encapsulation layer wraps part of the side walls, since the encapsulation layer itself is very thin, the part of the encapsulation layer covering on the sidewall will be thinner, generally below 5 μm, and the diameter of the hole is at least 0.09 mm, that is, 90 μm. Therefore, it can be considered that the hole diameter d' after encapsulation is reduced by 10% or less compared with the diameter d before encapsulation, and the centers of holes on the encapsulation layer, OLED device layer and substrate layer are all coincident. After the encapsulation is completed, the flexible substrate 501 needs to be peeled off from the support substrate 505 in the following methods. In the first method, the FPC circuit board 508 may be electrically connected to the contact electrode 504, and then a protective film 506 is applied over the encapsulation layer 503, as shown in FIG. 5B. The FPC circuit board 508 may be connected to an external power source in a continuous film-like form, preferably in a grid-like or frame-like form. The FPC circuit board 508 is only connected to the contact electrode 504 so that the encapsulation layer 503 is completely exposed. For the use of the FPC circuit board 508 in the OLED light-emitting panel, reference may be made to the application US20190376650 that the inventor of the present disclosure previously provides. The protective film 506 may be applied to the flexible panel in the form of laminate, and then the flexible substrate 501 may be peeled off from the support substrate 505. If the flexible substrate 501 is a solid film, the adhesive tape may be directly torn off, and if the flexible substrate 501 is a PI film, the PI film needs to be peeled off by laser, and preferably, the PI film is peeled off by laser. The material of the protective film includes, but is not limited to, PET, PEN, PI, an FPC circuit board, silicone rubber and other artificial materials, and may also be natural materials with good air permeability, such as silk and cotton and linen. If the material of the protective film is natural materials with good air permeability, no additional openings are needed. If the protective film 506 is a material with bad air permeability, the protective film 506 also needs to be perforated, as shown in FIG. 5C. The position of the hole on the protective film 506 should correspond to the position of the hole 507 formed on the flexible substrate and the OLED device, that is, the center point of the hole on the protective film coincides with the center o point of the hole 507 or the coincidence degree is more than 50%. Herein, the coincidence degree refers to the ratio of [the area of the overlapping part between the vertical projection of the protective film hole and the hole A on the substrate plane] to [the area of the vertical projection of the hole A on the substrate plane]. Preferably, the coincidence degree of holes is above 70%. The diameter of the hole on the protective film 506 is D, and preferably D ⩾ d. The hole on the protective film 506 may be perforated in advance, and in this case, alignment operation should be carried out during attaching the protective film 506 to ensure alignment with the inherent holes 507. Another scheme is to perforate holes after the protective film 506 is attached. This operation has the advantage that the center of the protective film can be basically aligned with the existing center o point without extra alignment, but the disadvantage is that there is a risk of damaging the OLED device during perforating. The perforating of the protective film can be carried out by stamping, laser and the like. In the second method, the protective film 506 can also be an FPC circuit board integrated with a circuit. The advantage of this method is that since the alignment system is generally provided during circuit bonding, the circuit bonding can be carried out synchronously when the protective film 506 is attached so that the problem of the hole alignment is solved. In this case, no additional FPC circuit board 508 is required. The thickness of the protective film 506 is generally 25 μm to 500 μm, preferably 50 μm to 200 μm. If the flexible OLED light-emitting panel uses a top-emission device, the protective film needs to be light-transmitting, with a light transmittance above 10%, preferably above 20%, more preferably above 50%. The third method is as shown in FIG. 5D. When the flexible substrate 501 is to be peeled off from the support substrate 505, a transfer film 5061 may be used to apply to a panel 530, then the flexible substrate 501 is peeled off from the support substrate 505, then the flexible substrate 501, together with the OLED device 502 and the encapsulation layer 503 on the flexible substrate 501, are transferred and attached to a flexible film 509, and then the transfer film 5061 is removed. The FPC circuit board 508 may be electrically connected to the contact electrode 504 before transfer, or may be electrically connected to the contact electrode 504 after the transfer film 5061 is removed. If the OLED device 502 is a bottom-emission device, the flexible film 509 is required to be transparent. If the flexible film 509 is a thin film with bad air permeability, such as a variety of plastic or silicone rubber materials, the flexible film 509 also needs to be perforated so that the flexible film 509 has a plurality of holes E, as shown in FIG. 5E. The perforating can be carried out by stamping, laser or the like. At this point, the position of the hole on the flexible film 509 should align with the position of the existing hole 507, that is, the center point of the hole on the flexible film 509 coincides with the center o point of the hole 507 or the coincidence degree is more than 50%. Herein, the coincidence degree refers to the ratio of [the area of the overlapping part between the vertical projection of the flexible film hole and the hole A on the substrate plane] to [the area of the vertical projection of the hole A on the substrate plane]. Preferably, the coincidence degree of holes is above 70%. Perforating can also be carried out from top to bottom, and the diameter D' of the hole is not greater than the diameter d' of the hole 507 to ensure that the existing device and encapsulation layer are not damaged, as indicated by arrows in FIG. 5E. This method can ensure that the center of the hole on the flexible film 509 coincides with the existing center. The flexible film 509 may already have holes, and the diameter should be no less than the diameter d of the hole 507. The hole on the flexible film 509 and the hole 507 need to be aligned with each other during transfer. Of course, the flexible film 509 can also be a material with its own voids, such as natural materials with good air permeability such as silk and cotton and linen, so that no additional holes are required. The thickness of the flexible film 509 is generally 25 μm to 500 μm, preferably 50 μm to 200 μm. Finally, the protective film 506 may be added on the encapsulation layer 503 of the flexible light-emitting panel 540, and the addition manner and the selection of the protective film are as described above and will not be repeated herein.

Figure 6A:
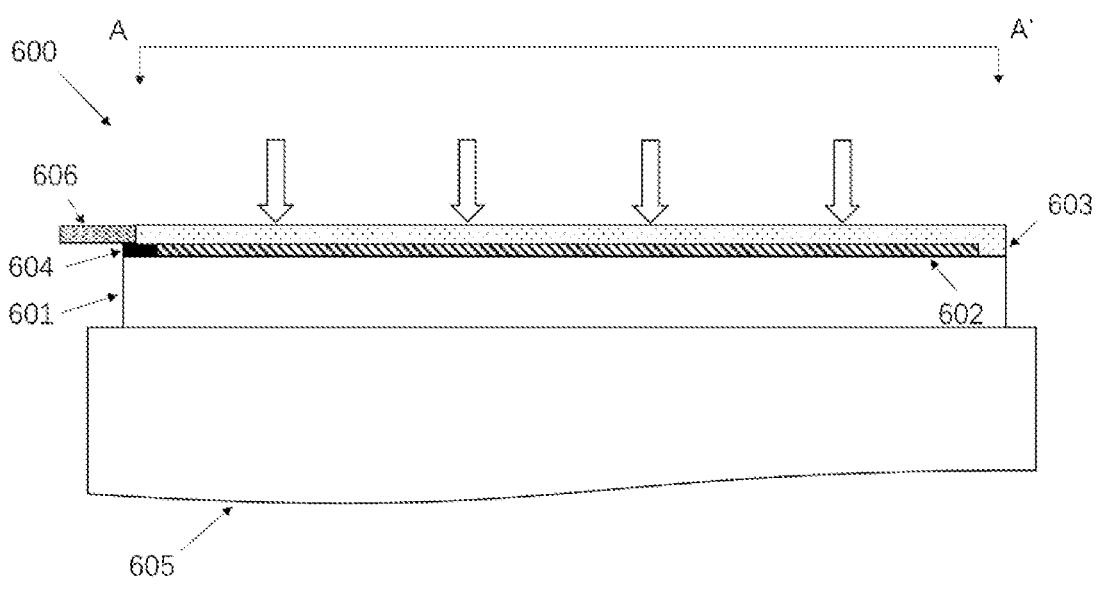
FIG. 6A is a schematic diagram showing the structure of the interface of a flexible OLED light-emitting plane having a support substrate of the present disclosure before perforating.
Figure 6B:
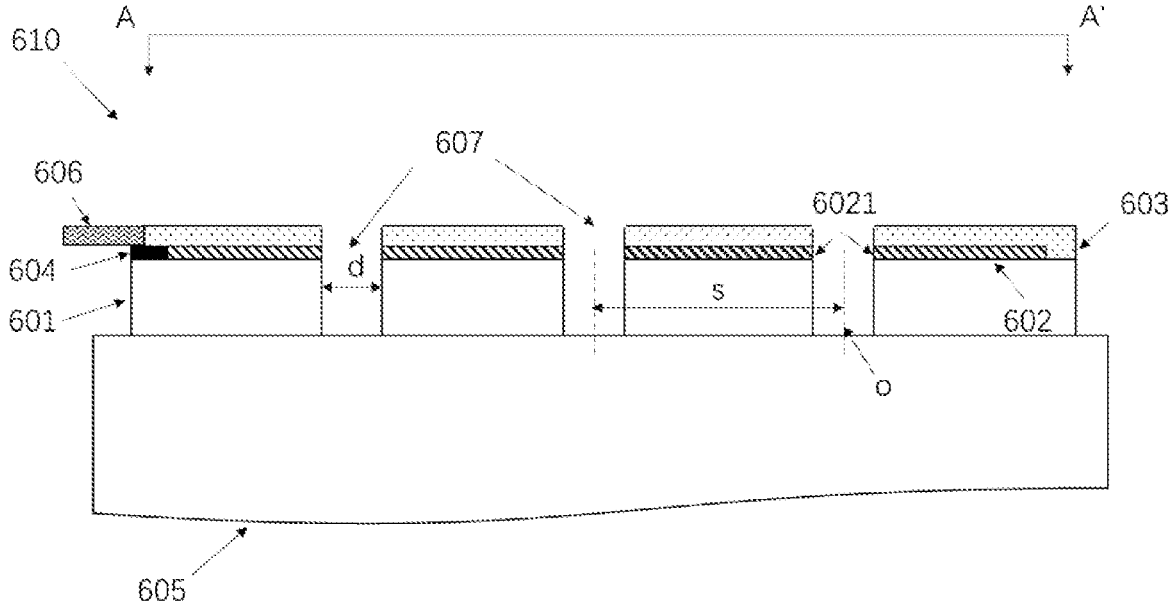
FIG. 6B is a schematic diagram showing the structure of the interface of a flexible OLED light-emitting plane having a support substrate of the present disclosure after perforating.

In some embodiments, the perforating may be carried out after both the OLED device and the encapsulation layer have been completed. As shown in FIG. 6A, a flexible substrate 601 is applied to the support substrate 605, and a prepared OLED device 602, a complete encapsulation layer 603 and a contact electrode 604 exposed outside the encapsulation layer 603 are on the flexible substrate 601. Since the total thickness of the entire OLED device 602 and the encapsulation layer 603 is generally about 10 μm to 15 μm, the holes 607 as shown in FIG. 6B can be precisely etched by laser from top to bottom (as indicated by arrows in FIG. 6A). A mask may be set on the finished device, then holes are formed on the encapsulation layer 603 and the OLED device 602 by plasma bombardment in the PECVD chamber, and then holes are formed on the flexible substrate 601 by laser or stamping. The hole 607 has a diameter d and a spacing s. The FPC circuit board 606 may be attached either before or after perforating is carried out. In this manner, the side 6021 of the OLED device 602 is exposed, potentially causing device performance degradation. At this point, the protective film and/or the flexible film can be applied in the subsequent process, and then the edge of the hole can be sintered by laser or high temperature. Since the protective film and flexible film can be generally made of plastic products or silicone rubber, such a protective film and flexible film will be melted under laser or high temperature and re-cured after the temperature is cooled to seal the side of the hole, avoiding the exposure of the OLED organic layer. Alternatively, the penetration and perforating can be carried out after the protective film and/or the flexible film are applied, that is, the protective film, the encapsulation layer, the OLED device, the flexible substrate and the flexible film are perforated together, and then the edges are sealed at high temperature. In this manner, alignment is avoided, and the process becomes simpler. In other embodiments, improvements may be made on the basis of the above. Specifically, the OLED device is initially encapsulated. For example, a semiconductor film with a thickness of 1 μm to 2 μm is deposited by PECVD, wherein the semiconductor film includes, but is not limited to, silicon oxide ($SiO_x$), alumina ($AlO_x$), silicon nitride ($SiN_x$) and so on. Then, the perforating is carried out, as described above. Then, an organic layer is printed to continue the encapsulation, and on this basis, the OLED device can be transferred back to PECVD to prepare a second semiconductor film and print a second organic layer. In this manner, the side 6021 of the OLED device can be protected by the encapsulation layer. Such a multi-layer encapsulation process is well known in the industry, and details will not be repeated herein.

Figure 7A:
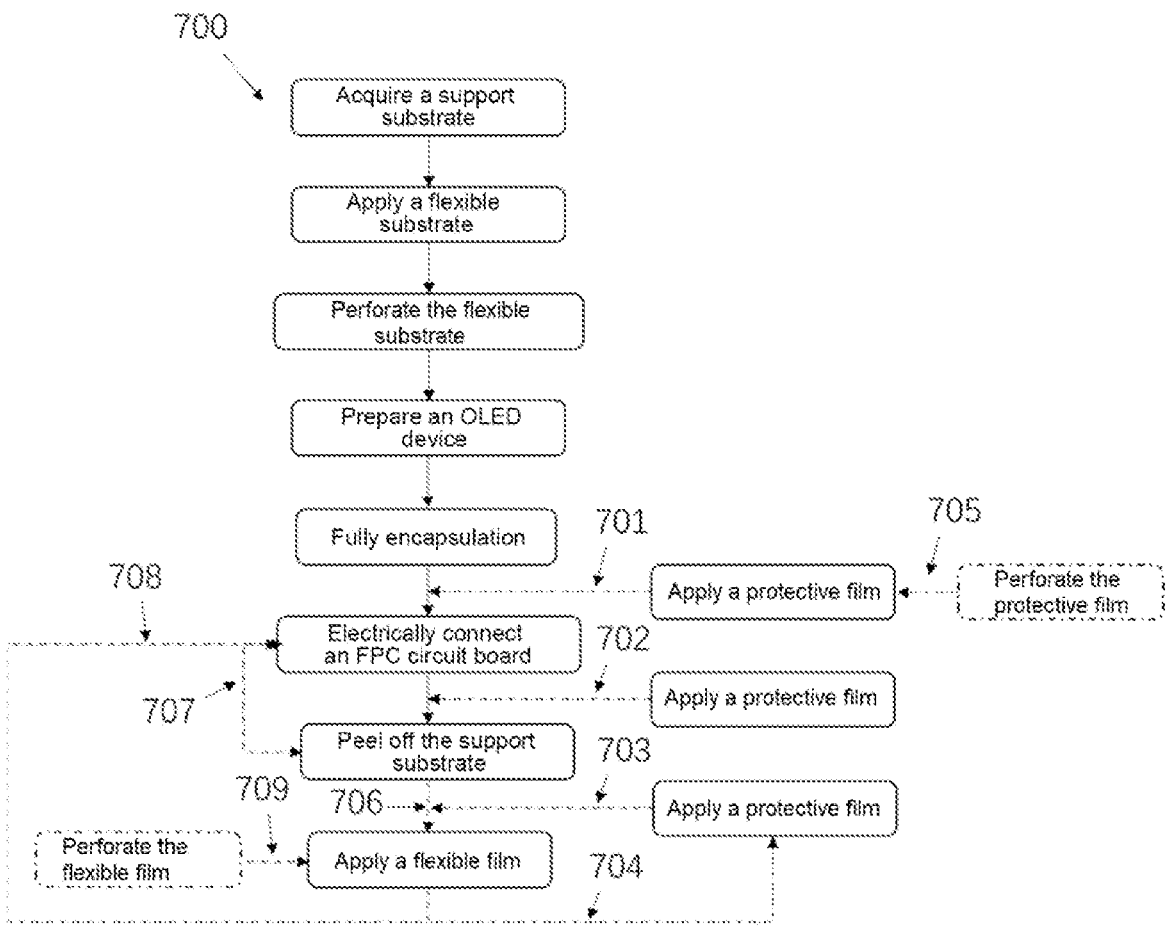
FIGS. 7A to 7B are flowcharts of a method for preparing a flexible OLED light-emitting module of the present disclosure.
Figure 7B:
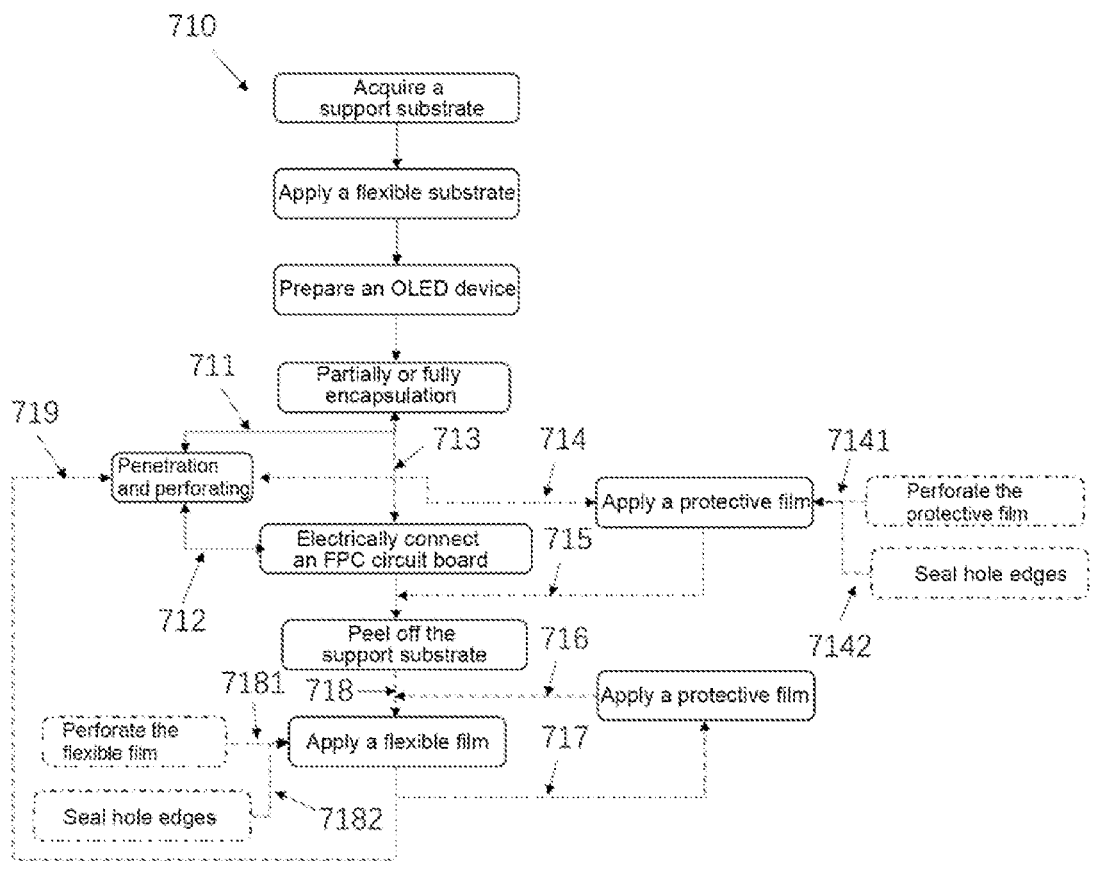

The flowchart 700 of a method for preparing a flexible OLED light-emitting module with good air permeability is shown in FIG. 7A. The core steps of the preparation process 700 include (all indicated by solid arrows): acquiring a support substrate, applying a flexible substrate on the support substrate, perforating the flexible substrate, preparing an OLED device on the flexible substrate having holes, then carrying out full encapsulation, electrically connecting an FPC circuit board to a contact electrode, and finally peeling off the support substrate. The order of electrically connecting the FPC circuit board and peeling off the support substrate can be reversed, that is, the support substrate is first peeled off and then the FPC circuit board is electrically connected, as shown by dashed arrow 707. Based on this core flow, there are optional steps indicated by dashed arrows, for example: applying a protective film before the FPC circuit board is electrically connected (step 701), or applying a protective film after the FPC circuit board is electrically connected but before the support substrate is peeled off (step 702), or applying a protective film after the support substrate is peeled off (steps 703 and 704). If a protective film with bad air permeability is applied, the protective film needs to be perforated (step 705) and aligned with the existing holes when the protective film is applied, and of course, perforating may be carried out after the protective film is applied. Additional optional steps are: applying a flexible film under the flexible substrate (step 706), and perforating the flexible film with bad air permeability in a similar manner as the protective film (step 709). The FPC circuit board may also be electrically connected after the flexible film has been applied, as shown in step 708. It is to be noted that the protective film per se may be an FPC circuit board, so the step of electrically connecting the FPC circuit board and applying the protective film are the same step. Another preparation process 710 is shown in FIG. 7B, and its core steps include (indicated by solid arrows): acquiring a support substrate, applying a flexible substrate on the support substrate, directly preparing an OLED device, and carrying out partial or full encapsulation, penetrating and perforating, electrically connecting an FPC circuit board, and peeling off the support substrate. If the device is fully encapsulated, penetration and perforating can be carried out directly (step 711), that is, holes are formed on the substrate, the OLED device and the encapsulation layer, then the FPC circuit board is electrically connected (step 712), and finally the support substrate is peeled off. Alternatively, after the device is fully encapsulated, the FPC circuit board is connected (step 713) and then penetration and perforating are carried out (step 712). If the circuit board is grid-like, holes are penetrated on the substrate, the OLED device and the encapsulation layer, and if the circuit board is a continuous thin film, holes are penetrated on the substrate, the OLED device, the encapsulation layer and the circuit board. Additional optional steps are: applying a protective film (step 714) and perforating the protective film (step 7141). Alternatively, penetration and perforating can be carried out after the protective film is applied, that is, the protective film, the encapsulation layer, the OLED device and the flexible substrate are perforated simultaneously, and then the edges of the holes and the protective film are sealed (step 7142). The protective film may also be applied after the FPC circuit board is electrically connected (step 715), or after the support substrate is peeled off (step 716), or after the flexible film is applied (step 717). Then, the preparation process may also include steps of perforating and sealing edges, not shown herein. Finally, there are still optional steps: applying a flexible film (step 718) and perforating the flexible film (step 7181). If penetration and perforating is carried out after the flexible film is applied, that is, the protective film, the encapsulation layer, the OLED device, the flexible substrate and the flexible film are perforated simultaneously (step 719), then optionally, a step of sealing the holes (step 7182) may be carried out.

The flexible OLED light-emitting module with good air permeability as described above can be applied to various phototherapy fields. For example, the flexible OLED light-emitting module with good air permeability as described above can be incorporated into various wearable phototherapy devices, including, but not limited to, OLED phototherapy facial masks, OLED phototherapy eye masks, OLED phototherapy neck protectors, OLED phototherapy hair growth cap liners or OLED phototherapy hair growth hats, OLED phototherapy waistband, OLED phototherapy blankets or OLED phototherapy baby clothes, OLED phototherapy band-aids, OLED phototherapy plaster patches, OLED phototherapy gloves, OLED phototherapy socks, and OLED phototherapy garments. In these wearable phototherapy devices, the flexible OLED light-emitting module can be cut into the desired form to be suitable for related applications, a single flexible OLED light-emitting module can be used, and a plurality of the light-emitting modules can be used in combination. These prepared wearable phototherapy products not only have a large light-emitting area, but also have good air permeability and are suitable for long-term wearing.

It is to be understood that various embodiments described herein are merely examples and not intended to limit the scope of the present disclosure. Therefore, it is apparent to the persons skilled in the art that the present disclosure as claimed may comprise variations from specific embodiments and preferred embodiments described herein. Many of materials and structures described herein may be substituted with other materials and structures without departing from the spirit of the present disclosure. It is to be understood that various theories as to why the present disclosure works are not intended to be limitative.

What is claimed is:

1. A flexible OLED light-emitting module, comprising:
a flexible substrate having a plurality of holes A;
OLED devices having a plurality of holes B and a contact electrode;
an encapsulation layer having a plurality of holes C; and an external circuit, wherein the external circuit is electrically connected to the contact electrode;
wherein the pluralities of holes A, B and C coincide to form through-holes penetrating the light-emitting module; the diameter of each of the plurality of holes A is between 0.09 mm and 5 mm, the diameters of each of the plurality of holes B and each of the plurality of holes C are between 90% to 100% of the diameter of each of the plurality of holes A, the minimum spacing between the plurality of holes A is S, and S is between 1 mm and 50 mm;
wherein the OLED devices have a common organic light-emitting layer; and
wherein the OLED devices are non-pixilated.

2. The flexible OLED light-emitting module of claim 1, wherein the external circuit is a flexible printed circuit (FPC).

3. The flexible OLED light-emitting module of claim 1, wherein the diameter of each of the plurality of holes A is between 0.1 mm and 3 mm.

4. The flexible OLED light-emitting module of claim 1, wherein the minimum spacing S between the plurality of holes A is between 1 mm and 30 mm.

5. The flexible OLED light-emitting module of claim 1, wherein the plurality of holes A are arranged at equal spacing.

6. The flexible OLED light-emitting module of claim 1, wherein the cross-section of each of the plurality of holes A, B and C is a circle, a polygon or an ellipse.

7. The flexible OLED light-emitting module of claim 1, wherein the area ratio of the plurality of holes A to the flexible substrate is between 0.01% and 50%.

8. The flexible OLED light-emitting module of claim 1, wherein the OLED device emits at least one light with a wavelength between 400 nm to 2000 nm.

9. The flexible OLED light-emitting module of claim 1, wherein the thickness of the flexible substrate is between 25 μm and 500 μm.

10. The flexible OLED light-emitting module of claim 1, wherein the material used for the flexible substrate is polyimide (PI).

11. The flexible OLED light-emitting module of claim 1, wherein the encapsulation layer is thin-film encapsulation layer.

12. The flexible OLED light-emitting module of claim 1, further comprising a protective film and/or a flexible film.

13. The flexible OLED light-emitting module of claim 12, wherein the protective film and/or the flexible film is transparent, or the protective film is an FPC, or the protective film and/or the flexible film is of a plastic or silicone rubber material, or the protective film and/or the flexible film is made of a natural material selected from silk or cotton and linen.

14. The flexible OLED light-emitting module of claim 12, wherein
the coincidence degree between the plurality of holes D and/or E with the plurality of holes A is more than 70%.

15. The flexible OLED light-emitting module of claim 12, wherein the thickness of the protective film and/or the flexible film is between 25 μm and 500 μm.

16. The flexible OLED light-emitting module of claim 12, wherein the edges of the plurality of holes A, B and C are sealed as a result of melting of the protective film and/or the flexible film.

17. The flexible OLED light-emitting module of claim 14, wherein the plurality of holes A, B, C, D and E are formed simultaneously.

18. The flexible OLED light-emitting module of claim 1, wherein the plurality of holes A, B and C are formed by a method selected from the group consisting of: stamping, dry etching, wet etching, laser etching, plasma bombardment, and combinations thereof.

19. A method for preparing the flexible OLED light-emitting module of claim 1, comprising the following steps:

a. acquiring a support substrate;

b. applying a flexible substrate on the support substrate;

c. preparing an OLED device;

d. encapsulating the OLED device and exposing a contact electrode;

e. electrically connecting an external circuit to the contact electrode of the OLED device;

f. peeling off the support substrate;

perforating step 1. forming a plurality of holes A on the flexible substrate, wherein the diameter of each of the plurality of holes A is between 0.09 mm and 5 mm, and the minimum spacing between the plurality of holes A is between 1 mm and 50 mm;

perforating step 2. forming a plurality of holes B and a plurality of holes C on the OLED device and an encapsulation layer, respectively, wherein, the diameters of each of the plurality of holes B and each of the plurality of holes C are between 90% to 100% of the diameter of each of the plurality of holes A, and the holes B and C and the holes A coincide;

wherein, in the above steps, perforating step 1 occurs at any time after step b, and perforating step 2 occurs simultaneously with step c or at any time after step c.

20. The method of claim 19, wherein the external circuit in step e is an FPC circuit board.

21. The method of claim 19, wherein perforating step 1 occurs between step b and step c, or between step d and step e, or between step e and step f.

22. The method of claim 19, wherein perforating step 2 occurs simultaneously with step c, or between step d and step e, or between step e and step f, or after step f.

23. The method of claim 19, wherein perforating step 1 and perforating step 2 occur simultaneously.

24. The method of claim 19, further comprising step j and/or step k, wherein step j is to apply a protective film and can occur at any time after step d, and step k is to apply a flexible film and can occur at any time after step f.

25. The method of claim 24, wherein step j further comprises step j-1, wherein step j-1 is to form a plurality of holes D on the protective film.

26. The method of claim 24, wherein step j occurs between step d and step e, or between step e and step f, or after step f, or simultaneously with step e.

27. The method of claim 25, wherein step j-1 and step j occur simultaneously, or step j-1 and perforating steps 1 and/or 2 occur simultaneously.

28. The method of claim 24, further comprising step k-1, wherein step k-1 is to form a plurality of holes E on the flexible film; step k-1 and step k occur simultaneously, or step k-1 and perforating steps 1 and/or 2 occur simultaneously.

29. The method of claim 19, further comprising step l, wherein step l is to melt and seal edges of the plurality of holes A, B, C, D, and/or E.

30. A phototherapy apparatus, comprising at least one flexible OLED light-emitting module of claim 1.

31. The flexible OLED light-emitting module of claim 1, the area ratio of the plurality of holes A to the flexible substrate is between 0.1% and 30%.

32. The flexible OLED light-emitting module of claim 1, the area ratio of the plurality of holes A to the flexible substrate is between 0.2% and 10%.

33. The flexible OLED light-emitting module of claim 1, the OLED device emits at least one light with a wavelength between 450 nm to 1000 nm.

34. The flexible OLED light-emitting module of claim 1, the thickness of the flexible substrate is between 30 μm and 200 μm.

35. The flexible OLED light-emitting module of claim 1, the material used for the flexible substrate is a plastic; the flexible OLED light-emitting module comprises a protective film and/or a flexible film; wherein the protective film and/or the flexible film is transparent, and the protective film and/or the flexible film is of a plastic or silicone rubber material; the protective film has a plurality of holes D and/or the flexible film has a plurality of holes E; wherein the coincidence degree between the plurality of holes D and/or E with the plurality of holes A is more than 50%; the pluralities of holes A, B, C, D and/or E are formed by laser etching; the edges of the pluralities of holes A, B and C are sealed by melting the protective film and/or the flexible film through the laser etching.

36. The phototherapy apparatus of claim 30, the phototherapy apparatus is selected from the group consisting of: a phototherapy facial mask, a phototherapy eye mask, a phototherapy neck protector, a phototherapy hair growth cap, a phototherapy waistband, a phototherapy blanket, a phototherapy band-aid, a phototherapy plaster patch, a phototherapy glove, a phototherapy sock or a phototherapy garment.

* * * * *